Jan. 9, 1968 R. E. HILEMAN 3,363,194
PHASE LOCK LOOP WITH EXTENDED CAPTURE RANGE
Filed May 24, 1965
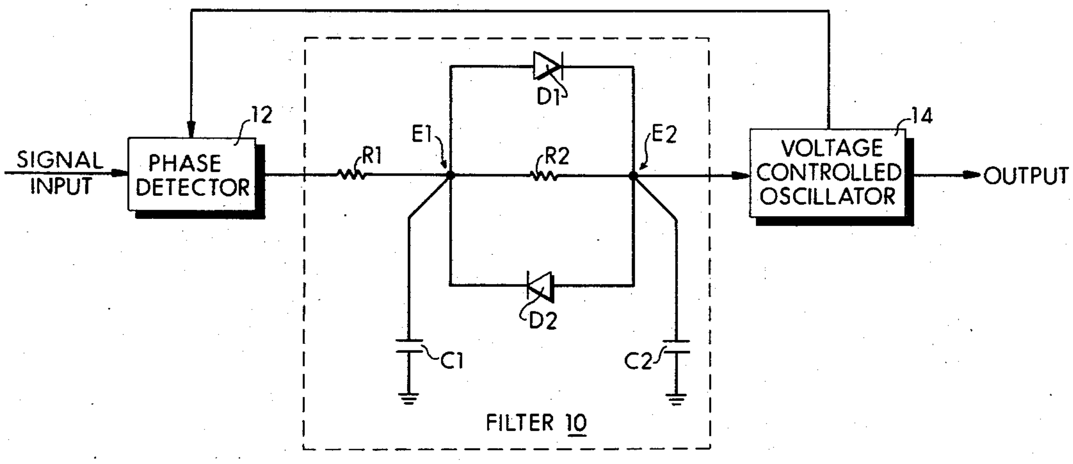
INVENTOR
RONALD E. HILEMAN
BY Spencer E. Olson
ATTORNEY United States Patent Office 3,363,194

Patented Jan. 9, 1968

3,363,194

PHASE LOCK LOOP WITH EXTENDED CAPTURE RANGE

Ronald E. Hileman, Clarence, N.Y., assignor to Sylvania Electric Products Inc., a corporation of Delaware Filed May 24, 1965, Ser. No. 458,233
1 Claim. (Cl. 331—17)

ABSTRACT OF THE DISCLOSURE

In a phase lock loop including a voltage controlled oscillator and a phase detector having one of its inputs connected to the output of the oscillator, a two-state adaptive filter connected between the output of the phase detector and the control element of the oscillator. The filter comprises a pair of cascade-connected resistor-capacitor networks with two oppositely poled diodes connected in parallel across the resistor of the second network. The diodes are rendered conducting in response to an alternating current signal appearing at the junction of the first and second resistor-capacitor networks, thereby shunting the second network resistor to establish a filter time constant which provides a wide loop capture range. When the loop is phase locked, a substantially direct current signal appears at the junction of the resistor-capacitor networks which causes the diodes to become nonconducting, thereby removing the shunt bypass of the second network resistor to establish a filter time constant which provides a narrow capture range.

This invention relates to improvements in phase-locked oscillator control loops.

The basic elements of the elementary phase lock loop comprise an oscillator adapted to be controlled in phase and frequency, a phase detector for comparing a feedback signal from the oscillator with an input signal, and a low pass filter connected between the phase detector output and the control element of the oscillator. If there is a phase difference between the input signal and oscillator feedback signal, the phase detector generates an error signal which is applied via the low pass filter to correct the oscillator phase or frequency toward phase lock with the incoming signal.

Among the many uses of a phase lock loop in the field of radio communications is its wide utilization as a narrow band tracking filter in applications such as Doppler tracking radio receivers and color tone burst detection in color television receivers. A problem encountered in employing a phase lock loop as a filter, however, is that the loop is generally restricted by noise considerations to a relatively narrow capture or lock-on range and a wide tracking range. In many applications, however, it is desirable that the time required to phase lock the oscillator be minimized and that the loop have a wide capture range; i.e., be capable of pulling the oscillator into phase lock when its frequency differs greatly from the frequency of the incoming signal. The fast capture time and desired capture range can be achieved by increasing the bandwidth of the loop. However, increasing loop bandwidth permits a wider spectrum of noise voltages to be present in the loop when the oscillator is phase locked. These noise voltages cause oscillator phase shift errors since the noise voltages are indistinguishable from the useful error signal provided by the phase detector.

In other words, the effectiveness of the filter, i.e., its narrow band characteristic, is proportional to the low pass filter time constant, but a long time constant results in a narrow capture range. If the low pass filter time constant is shortened, to increase the capture range, the effectiveness of the loop is degraded.

Prior art phase lock loop designs known to applicant attack this problem by employing complex adaptive filters whereby the filter is changed from a short time constant for acquisition to a long time constant for tracking. For example, some of these circuits use a separate phase detector operating in quadrature with the phase detector in the loop to detect phase lock and then switch time constants in response thereto. This type of adaptive phase lock loop, known as a quadri-correlator, involves a considerable amount of circuit complexity.

With an appreciation of the foregoing shortcomings of available phase lock loops, it is an object of the present invention to provide an improved phase lock loop having a practical and effective means for automatically adapting its filter time constant.

It is another object of the invention to provide a circuit of minimum complexity for extending the capture range of phase lock loops.

Briefly, these and related objects are achieved by the incorporation in a phase lock loop of the type including a phase detector, low pass filter, and a voltage controlled oscillator, a filter comprising a pair of cascaded RC networks with diodes across the second resistor. A two-state adaptive feature is thereby provided such that when the loop is not in phase lock a wide capture range is provided, and when phase locked, the loop is automatically switched to a narrow capture range to provide effective filtering action during tracking.

The invention will be better understood from the following description and the accompanying drawing, the single figure of which is a combined schematic and block diagram of a phase lock loop embodying the invention.

It will be apparent to ones skilled in the art that except for the low pass filter contained within the dotted rectangle 10, the phase lock loop is similar to those of the prior art. More specifically, it comprises a phase detector 12 to which the input signal is applied, low pass filter 10 to which the output of the phase detector is applied, and a voltage controlled oscillator 14 whose phase and frequency is controlled by a signal from filter 10 and whose output is applied to phase detector 12. The phase error signal detected by phase detector 12 is applied to the low pass filter which converts it to a steering voltage signal for controlling the phase and frequency of oscillator 14. The voltage controlled oscillator may take any of a number of known forms which include means for controlling the frequency in response to the magnitude of an applied direct current voltage; e.g., a variable capacitance diode. Further, the means for providing a feedback signal from the oscillator to the phase detector need not be provided by a direct connection but may comprise any other circuit for deriving a voltage wave indicative of the phase and frequency of the oscillator.

Referring now to the low pass filter 10, it will be observed that the filter circuit comprises a pair of cascaded RC sections with a pair of diodes connected in shunt with the second resistor. The first and second sections consist of resistor-capacitor networks R1, C1 and R2, C2, respectively. Resistors R1 and R2 are serially connected between the input and output of the filter; capacitor C1 is connected between the junction of R1 and R2 and ground; and, capacitor C2 is connected between the output terminal of R2 and ground.

Diodes D1 and D2 are connected in parallel across resistor R2 and are oppositely poled relative to each other, the anode of D1 and cathode of D2 being connected at the junction of R1 and R2 and the cathode of D1 and anode of D2 being connected at the output terminal of R2.

The cut off frequencies are widely separated (e.g. 100 to 1) so that the phase lock loop is stable. The response of the loop filter is determined primarily by the lower corner frequency due to R2 and C2. The higher corner frequency of R1 and C1 introduces appreciable phase shift at the frequency where R2 and C2 are causing substantial attenuation of loop gain. Hence, if the loop gain is less than unity at this frequency, the loop is stable.

When the loop is not in phase lock, a difference frequency will appear at the phase detector output. The first filter section is designed to pass the difference frequency. The second RC section without diodes would attenuate the difference frequency if it were large. This would result in a small capture range. However, the addition of the diodes causes the AC swing of the difference frequency to be conducted on to C2. When the diodes conduct, the capacitors C1 and C2 are effectively in parallel and the filter has a corner frequency at $$f_c=\frac{1}{2\pi R_1(C_1+C_2)}$$

which provides a wide capture range. ($R_1$, $C_1$ and $C_2$ represent the values of components R1, C1 and C2, respectively.)

Once the loop has phase locked, the difference frequency disappears and the signal at R1, C1 (junction E1) will become fixed at some D.C. voltage. The second filter section R2, C2 will charge to the same D.C. potential (at junction E2). When the two potentials are equal, the diodes are both off. The low pass filter then has a time constant determined by R2 and C2 as long as the differences between E1 and E2 do not exceed the turn on voltages of the diodes.

One particularly useful application of the present invention is described in a copending application Ser. No. 450,801, filed Apr. 26, 1965, and assigned to the assignee of the present application. Here the two-state adaptive phase lock loop is employed in one embodiment of a television camera sync control circuit which is part of a closed loop system for automatically controlling the phase timing of selected remote cameras from a control center. The voltage controlled oscillator of the loop is the drive source for the camera sync pulse generator. Correction information is transmitted to the camera by means of frequency and phase shifts of a control tone. For correction of vertical sync pulse timing, the control center generates a 5 c.p.s. frequency shift in a 3.15 kc./sec. control tone which is within the relatively wide capture range of the phase lock loop. Application of this frequency shifted control tone to the phase lock loop forces the oscillator to shift its frequency by an amount sufficient to correct vertical sync pulse timing by several lines per second.

Upon completion of vertical synchronization, the control center automatically switches to the horizontal synchronizing mode in which the control tone is shifted by approximately 25 $\mu$secs. per second. The loop oscillator follows this phase shift to phase correct the horizontal sync pulse timing at an acquisition rate of 25 $\mu$secs. per second. Upon synchronization of the horizontal, a filter circuit similar to low pass filter 10 switches the loop to a narrow capture range, as described above, to increase the stability and filter action of the loop for the tracking mode.

While a particular embodiment of the invention has been illustrated, it is to be understood that the applicant does not wish to be limited thereto since modifications will now be suggested to ones skilled in the art. Applicant, therefore, contemplates by the appended claim to cover all such modifications as fall within the true spirit and scope of his invention.

What is claimed is:

1. A phase lock loop comprising, in combination, a phase detector having first and second input terminals and an output terminal, means for applying an input signal to said first input terminal, a voltage controlled oscillator having a control element and an output terminal connected to the second input terminal of said phase detector, said phase detector being operative in response to a difference in phase between said input signal and the output signal of said oscillator to produce an error signal, a filter circuit having input and output terminals, means connecting the output terminal of said detector to the input terminal of said filter, and means connecting the output terminal of said filter to said control element of said oscillator, said filter circuit comprising: first and second resistors serially connected between the input and output terminals of said filter, a first capacitor connected between the junction of said first and second resistors and ground, a second capacitor connected between the output terminal of said filter and ground, a first diode connected in shunt with said second resistor, and a second diode, oppositely poled with respect to said first diode, also connected in shunt with said second resistor, said diodes being rendered conducting in response to an alternating current signal appearing at the junction of said resistors and being rendered nonconducting in response to a substantially direct current signal at the junction of said resistors.

References Cited

UNITED STATES PATENTS

| | | | |
|---|---|---|---|
| 2,617,037 | 11/1952 | Hugenholtz | 331—17 X |
| 2,730,616 | 1/1956 | Bastow | 331—17 X |
| 3,078,421 | 2/1963 | Heuer et al. | 331—17 |
| 3,287,657 | 11/1966 | Widl | 331—17 |
| 3,309,619 | 3/1967 | Schucht | 331—17 |

ROY LAKE, *Primary Examiner.*

J. B. MULLINS, *Assistant Examiner.*